(12) United States Patent
Pletcher et al.

(10) Patent No.: US 8,750,810 B2
(45) Date of Patent: Jun. 10, 2014

(54) POWER AMPLIFIER WITH SWITCHED OUTPUT MATCHING FOR MULTI-MODE OPERATION

(75) Inventors: Nathan Pletcher, San Diego, CA (US); Aristotele Hadjichristos, San Diego, CA (US); Yu Zhao, San Diego, CA (US); Babak Nejati, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 192 days.

(21) Appl. No.: 12/623,248

(22) Filed: Nov. 20, 2009

(65) Prior Publication Data

US 2011/0018632 A1    Jan. 27, 2011

Related U.S. Application Data

(60) Provisional application No. 61/228,511, filed on Jul. 24, 2009.

(51) Int. Cl.
*H01Q 11/12* (2006.01)
*H04B 1/04* (2006.01)

(52) U.S. Cl.
USPC .... 455/91; 455/127.1; 455/127.3; 455/127.4; 330/51; 330/144; 330/295

(58) Field of Classification Search
USPC ............. 455/91, 107, 114.2–114.3, 121–125, 455/127.1–127.5, 129; 330/51, 144, 295
See application file for complete search history.

(56) References Cited

U.S. PATENT DOCUMENTS

| | | |
|---|---|---|
| 4,015,223 A | 3/1977 | Cheze |
| 4,263,653 A | 4/1981 | Mecklenburg |
| 4,375,051 A | 2/1983 | Theall |

(Continued)

FOREIGN PATENT DOCUMENTS

| | | |
|---|---|---|
| CN | 1282140 A | 1/2001 |
| CN | 1367952 A | 9/2002 |

(Continued)

OTHER PUBLICATIONS

International Search Report and Written Opinion—PCT/US2010/043156, International Searching Authority—European Patent Office, Nov. 2, 2010.

(Continued)

*Primary Examiner* — Simon Nguyen
(74) *Attorney, Agent, or Firm* — Ramin Mobarhan (57) ABSTRACT

Exemplary embodiments are directed to a transmitter with a power amplifier and a switched output matching circuit implementing a plurality of output paths for a plurality of operating modes is described. The power amplifier receives an input RF signal and provides an amplified RF signal. An output matching network performs impedance transformation from low impedance at the power amplifier output to higher impedance at the matching network output. The plurality of output paths are coupled to the output matching network. Each output path provides a different target output impedance for the power amplifier and routes the amplified RF signal from the power amplifier to an antenna when that output path is selected. Each output path may include a matching network coupled in series with a switch. The matching network provides the target output impedance for the power amplifier when the output path is selected. The switch couples or decouples the output path to/from the power amplifier.

25 Claims, 10 Drawing Sheets

(56) References Cited

U.S. PATENT DOCUMENTS

| | | | |
|---|---|---|---|
| 4,493,112 A | 1/1985 | Bruene | |
| 4,559,503 A | 12/1985 | Camand et al. | |
| 4,612,669 A | 9/1986 | Nossen | |
| 5,023,688 A | 6/1991 | Ando et al. | |
| 5,208,537 A | 5/1993 | Rietsch et al. | |
| 5,300,068 A | 4/1994 | Rosar et al. | |
| 5,361,403 A | 11/1994 | Dent | |
| 5,483,680 A | 1/1996 | Talbot | |
| 5,530,923 A * | 6/1996 | Heinonen et al. | 455/126 |
| 5,541,554 A * | 7/1996 | Stengel et al. | 330/51 |
| 5,564,086 A | 10/1996 | Cygan et al. | |
| 5,673,287 A * | 9/1997 | Colvis et al. | 375/216 |
| 5,774,017 A | 6/1998 | Adar | |
| 5,778,308 A | 7/1998 | Sroka et al. | |
| 5,969,582 A * | 10/1999 | Boesch et al. | 333/129 |
| 5,973,557 A | 10/1999 | Miyaji et al. | |
| 6,020,794 A | 2/2000 | Wilbur | |
| 6,166,598 A | 12/2000 | Schlueter | |
| 6,188,877 B1 * | 2/2001 | Boesch et al. | 455/74 |
| 6,215,359 B1 | 4/2001 | Peckham et al. | |
| 6,317,608 B1 * | 11/2001 | Glocker | 455/553.1 |
| 6,362,690 B1 | 3/2002 | Tichauer | |
| 6,370,364 B1 | 4/2002 | Liimatainen | |
| 6,389,269 B1 * | 5/2002 | Nanni et al. | 455/93 |
| 6,414,562 B1 | 7/2002 | Bouisse et al. | |
| 6,441,768 B2 | 8/2002 | Cho | |
| 6,570,462 B2 | 5/2003 | Edmonson et al. | |
| 6,603,351 B2 | 8/2003 | Suzuki | |
| 6,606,483 B1 * | 8/2003 | Baker et al. | 455/126 |
| 6,759,916 B2 | 7/2004 | Ishizaki et al. | |
| 6,771,130 B2 | 8/2004 | Hasegawa et al. | |
| 6,859,104 B2 | 2/2005 | Toncich et al. | |
| 6,865,399 B2 * | 3/2005 | Fujioka et al. | 455/553.1 |
| 6,946,847 B2 | 9/2005 | Nishimori et al. | |
| 6,950,637 B2 * | 9/2005 | Kim | 455/127.4 |
| 6,992,543 B2 | 1/2006 | Luetzelschwab et al. | |
| 7,009,455 B2 | 3/2006 | Toncich et al. | |
| 7,010,073 B2 | 3/2006 | Black et al. | |
| 7,126,386 B2 | 10/2006 | Tumer | |
| 7,151,411 B2 | 12/2006 | Martin et al. | |
| 7,176,634 B2 | 2/2007 | Kitamura et al. | |
| 7,187,231 B2 | 3/2007 | McGrath et al. | |
| 7,215,933 B1 | 5/2007 | Tse et al. | |
| 7,417,508 B1 | 8/2008 | Quaglietta | |
| 7,443,236 B2 | 10/2008 | Dow et al. | |
| 7,509,100 B2 | 3/2009 | Toncich | |
| 7,512,386 B2 | 3/2009 | Kalajo et al. | |
| 7,567,782 B2 * | 7/2009 | Liu et al. | 455/121 |
| 7,580,684 B2 | 8/2009 | Cyr et al. | |
| 7,616,054 B2 | 11/2009 | Jeon et al. | |
| 7,782,134 B2 | 8/2010 | Drogi et al. | |
| 7,868,699 B2 | 1/2011 | Ono et al. | |
| 7,893,763 B2 | 2/2011 | Andrews | |
| 7,893,769 B2 | 2/2011 | Asano | |
| 7,911,277 B2 | 3/2011 | Paul et al. | |
| 7,917,170 B2 * | 3/2011 | Zhitnitsky | 455/552.1 |
| 8,000,737 B2 * | 8/2011 | Caimi et al. | 455/550.1 |
| 8,072,272 B2 | 12/2011 | Zhao et al. | |
| 8,111,111 B2 | 2/2012 | Van | |
| 8,131,232 B2 | 3/2012 | Muhammad | |
| 8,140,033 B2 | 3/2012 | Chan et al. | |
| 8,213,886 B2 | 7/2012 | Blin | |
| 8,280,323 B2 | 10/2012 | Thompson | |
| 8,306,490 B2 | 11/2012 | Tanoue et al. | |
| 8,368,470 B2 | 2/2013 | Alidio et al. | |
| 2001/0020911 A1 | 9/2001 | Cho et al. | |
| 2002/0094037 A1 | 7/2002 | Darabi et al. | |
| 2003/0193997 A1 * | 10/2003 | Dent et al. | 375/219 |
| 2004/0132441 A1 | 7/2004 | Livet et al. | |
| 2004/0224649 A1 | 11/2004 | Shamsaifar | |
| 2005/0159119 A1 | 7/2005 | Kataoka et al. | |
| 2005/0221855 A1 | 10/2005 | Kuriyama et al. | |
| 2005/0225388 A1 | 10/2005 | Ramachandran et al. | |
| 2005/0227640 A1 | 10/2005 | Haque et al. | |
| 2006/0028301 A1 | 2/2006 | Kamata et al. | |
| 2006/0160501 A1 | 7/2006 | Mendolia et al. | |
| 2006/0164162 A1 | 7/2006 | Dauphinee et al. | |
| 2006/0166664 A1 | 7/2006 | Livet et al. | |
| 2007/0197180 A1 | 8/2007 | McKinzie et al. | |
| 2007/0207748 A1 * | 9/2007 | Toncich | 455/107 |
| 2007/0218844 A1 | 9/2007 | Alanen et al. | |
| 2007/0222523 A1 | 9/2007 | Arell | |
| 2007/0222697 A1 | 9/2007 | Caimi et al. | |
| 2007/0291173 A1 | 12/2007 | Hsin | |
| 2008/0242237 A1 | 10/2008 | Rofougaran et al. | |
| 2008/0266021 A1 | 10/2008 | Van Bezooijen et al. | |
| 2008/0284539 A1 | 11/2008 | Tateoka et al. | |
| 2008/0290947 A1 | 11/2008 | Dawe | |
| 2009/0002077 A1 | 1/2009 | Rohani et al. | |
| 2009/0318093 A1 | 12/2009 | Prikhodko et al. | |
| 2010/0308933 A1 | 12/2010 | See et al. | |
| 2010/0321086 A1 | 12/2010 | See et al. | |
| 2011/0043956 A1 | 2/2011 | Su et al. | |
| 2011/0316636 A1 | 12/2011 | Zhao et al. | |
| 2012/0112834 A1 | 5/2012 | Van | |

FOREIGN PATENT DOCUMENTS

| | | |
|---|---|---|
| CN | 1677848 A | 10/2005 |
| CN | 1826727 A | 8/2006 |
| CN | 101095285 A | 12/2007 |
| CN | 101432973 A | 5/2009 |
| CN | 101502004 A | 8/2009 |
| EP | 0982852 A2 | 3/2000 |
| EP | 1727279 A1 | 11/2006 |
| EP | 1916772 A1 | 4/2008 |
| GB | 2356093 A | 5/2001 |
| JP | S6361812 U | 4/1988 |
| JP | H02161769 A | 6/1990 |
| JP | H07263986 A | 10/1995 |
| JP | H08167819 A | 6/1996 |
| JP | 11055047 A | 2/1999 |
| JP | 2001068941 A | 3/2001 |
| JP | 3192907 B2 | 7/2001 |
| JP | 2003504929 A | 2/2003 |
| JP | 2005210316 A | 8/2005 |
| JP | 2005524325 A | 8/2005 |
| JP | 2005268895 A | 9/2005 |
| JP | 2005294894 A | 10/2005 |
| JP | 2007531470 A | 11/2007 |
| JP | 2008516508 A | 5/2008 |
| JP | 2008521318 A | 6/2008 |
| JP | 2008521319 A | 6/2008 |
| JP | 2008219758 A | 9/2008 |
| JP | 2008288769 A | 11/2008 |
| WO | WO0105028 | 1/2001 |
| WO | WO-03094345 A2 | 11/2003 |
| WO | WO2004034569 | 4/2004 |
| WO | 2005006832 A2 | 1/2005 |
| WO | 2005101649 A2 | 10/2005 |
| WO | 2005101678 A2 | 10/2005 |
| WO | WO2006038167 A1 | 4/2006 |
| WO | WO-2006054245 A1 | 5/2006 |
| WO | WO2006054246 A1 | 5/2006 |
| WO | 2007107633 A1 | 9/2007 |
| WO | 2008014029 A2 | 1/2008 |

OTHER PUBLICATIONS

Adar, A.; DeMoura, J.; Balshem, H.; Lott, J.; "A High Efficiency Single Chain GAAS MESFET MMIC Dual Band Power Amplifier for GSM/DCS Handsets", Gallium Arsenide Integrated Circuit (GaAs IC) Symposium, 1998. Technical Digest 1998., 20th Annual; Digital Object Identifier: 10.1109/GAAS.1998.722629; Publication Year: 1998 , pp. 69-72.

Vaha-Heikkila, T.; Rebeiz, G.M.; "A 20-50 Ghz Reconfigurable Matching Network for Power Amplifier Applications", Microwave Symposium Digest, 2004 IEEE MTT-S International; vol. 2 Digital Object Identifier: 10.1109/MWSYM2004.1339059; Publication Year: 2004 , pp. 717-720 vol. 2.

Bezooijen A, et al., "Power Amplifier Protection by Adaptive Output Power Control", IEEE JSSC, vol. 42, No. 9, Sep. 2007, pp. 1834-1841.

(56) References Cited

OTHER PUBLICATIONS

Carrara F, et al., "A Methodology for Fast VSWR Protection Implemented in a Monolithic 3-W 55% PAE RF CMOS Power Amplifier", IEEE JSSC, vol. 43, No. 9, Sep. 2008, pp. 2057-2066.

Chowdhury D et al., "A single-chip highly linear 2.4GHz 30dBm power amplifier in 90nm CMOS", Solid-State Circuits Conference—Digest of Technical Papers, 2009, ISSCC 2009, IEEE International, IEEE, Piscataway, NJ, USA, Feb. 8, 2009, pp. 378-379,379A, XP031466144, ISBN, 978-1-4244-3458-9.

Minsik Ahn, et al., "A Novel Multi-Stack Device Structure and its Analysis for High Power CMOS Switch Design", Microwave Symposium, 2007. IEEE/MTT-S International, IEEE, PI, Jun. 1, 2007, pp. 1393-1396, XP031112198, ISBN, 978-1-4244-0687-6.

Sanielevici S A, et al., "A 900-MHz Transceiver Chipset for Two-Way Paging Applications", IEEE JSSC, vol. 33, No. 12, Dec. 1998, pp. 2160-2168.

Scuderi A, et al., "A VSWR-Protected Silicon Bipolar RF Power Amplifiers with Soft-Slope Power Control", IEEE JSSC, vol. 40, No. 3, Mar. 2005, pp. 611-621.

Su D, et al., "An IC for Linearizing RF Power Amplifiers Using Envelope Elimination and Restoration", IEEE JSSC, vol. 33, No. 12, Dec. 1998, pp. 2252-2258.

Tongqiang Gao, et al., "A novel CMOS transmitter front-end for mobile RFID reader", Radio Frequency Integrated Circuits Symposium, 2009. RFIC 2009. IEEE, IEEE, Piscataway, NJ, USA, Jun. 7, 2009, pp. 105-108, XP031480236, ISBN, 978-1-4244-3377-3.

van Bezooijen, A., et al., "Adaptive Impedance-Matching Techniques for Controlling L Networks", Circuits and Systems I: Regular Papers, IEEE Transactions on; vol. 57, Issue: 2; Digital Object Identifier: 10.1 109/TCSI.2009.2023764 Feb. 2010, pp. 495-505.

Wang et al., "A Nonlinear Capacitance Cancellation Technique and its Application to a CMOS Class AB Power Amplifier," 2001, IEEE Radio Frequency Integrated Circuits Symposium, May 20, 2001, pp. 39-42, XP010551317.

Yao-Jen Chuang, et al., "A novel bubble tolerant thermometer-to-binary encoder for flash A/D converter", VLSI Design, Automation and Test, 2005. (VLSI-TSA-DAT). 2005 IEEE VLSI 20050427; 20050427—20050429 Piscataway, NJ, USA,IEEE, US, Apr. 27, 2005, pp. 315-318, XP010829593, DOI: DOI:10.1109/VDAT.2005. 1500084 ISBN: 978-0-7803-9060-7 the whole document.

* cited by examiner

POWER AMPLIFIER WITH SWITCHED OUTPUT MATCHING FOR MULTI-MODE OPERATION

CLAIM OF PRIORITY UNDER 35 U.S.C. §119

The present application for patent claims priority to Provisional U.S. Application Ser. No. 61/228,511, entitled "SWITCHED PA OUTPUT MATCHING NETWORK FOR MULTI-STANDARD OPERATION," filed Jul. 24, 2009, assigned to the assignee hereof, and expressly incorporated herein by reference.

BACKGROUND

I. Field

The present disclosure relates generally to electronics, and more specifically to a power amplifier and an output matching circuit.

II. Background

Amplifiers are commonly used in various electronic devices to provide signal amplification. Different types of amplifiers are available for different uses. For example, a wireless communication device such as a cellular phone may include a transmitter and a receiver for bi-directional communication. The transmitter may utilize a power amplifier (PA), the receiver may utilize a low noise amplifier (LNA), and the transmitter and receiver may utilize variable gain amplifiers (VGAs).

A power amplifier is an amplifier that can provide high output power for a signal to be transmitted. A power amplifier typically uses a matching network to translate a target impedance (e.g., 50 Ohms) at an antenna to a different impedance (e.g., 4 Ohms) at the power amplifier output. The matching network is typically fixed and hence presents the power amplifier with a fixed impedance or load line. The fixed impedance may be selected for maximum output power or high efficiency for the power amplifier. The fixed impedance may result in good performance for the power amplifier in operating scenarios for which the impedance is selected but may result in sub-optimal performance in other operating scenarios.

DETAILED DESCRIPTION

The word "exemplary" is used herein to mean "serving as an example, instance, or illustration." Any design described herein as "exemplary" is not necessarily to be construed as preferred or advantageous over other designs.

A transmitter comprising a power amplifier and a switched output matching circuit is described herein. The switched output matching circuit supports a plurality of output paths for a plurality of operating modes. The transmitter may be used for various electronic devices such as wireless communication devices, cellular phones, personal digital assistants (PDAs), handheld devices, wireless modems, laptop computers, cordless phones, Bluetooth devices, consumer electronic devices, etc. For clarity, the use of the transmitter in a wireless communication device is described below.

Figure 1:
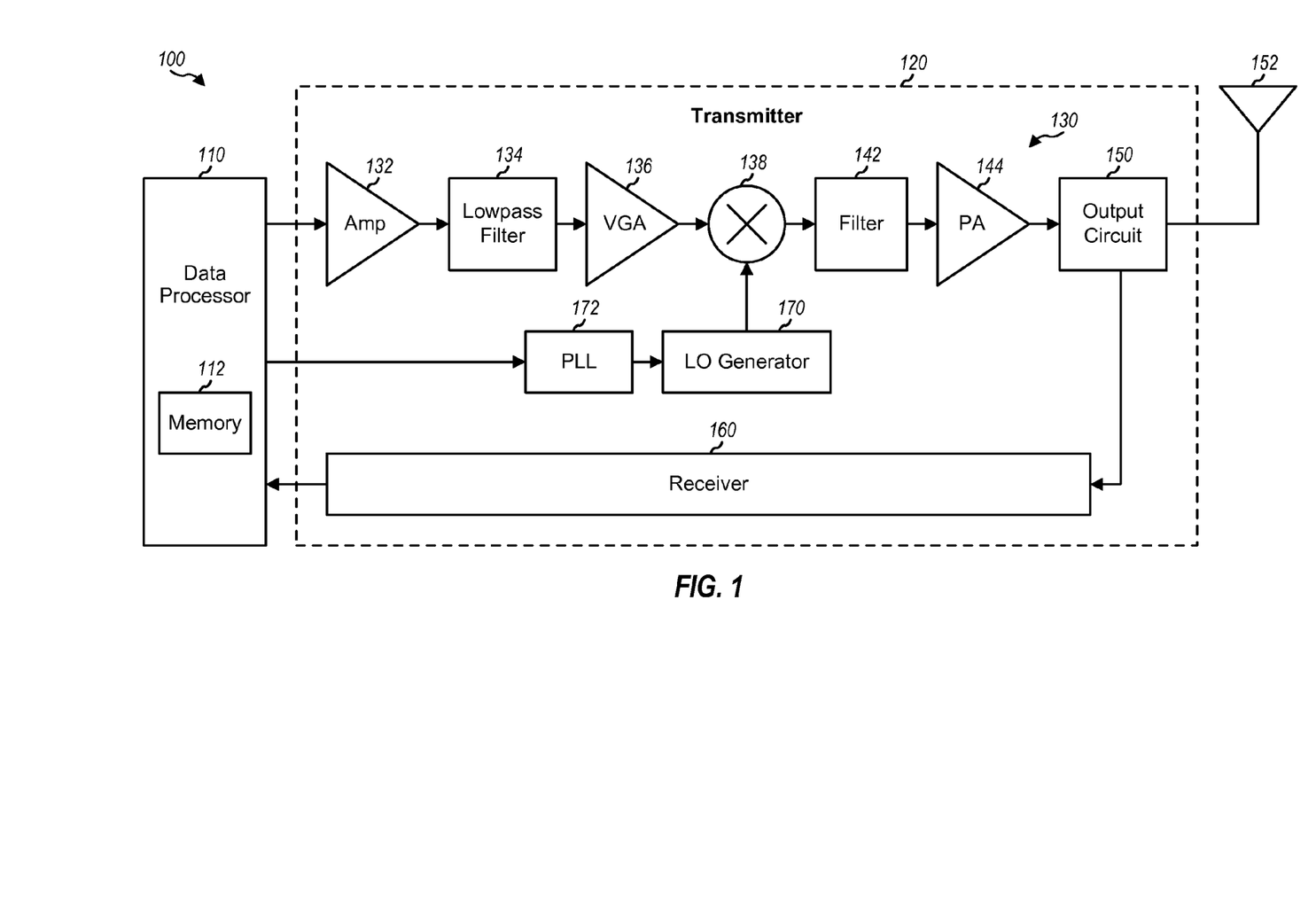
FIG. 1 shows a block diagram of a wireless communication device.

FIG. 1 shows a block diagram of an exemplary design of a wireless communication device 100. In this exemplary design, wireless device 100 includes a data processor 110 and a transceiver 120. Transceiver 120 includes a transmitter 130 and a receiver 160 that support bi-directional wireless communication. In general, wireless device 100 may include any number of transmitters and any number of receivers for any number of communication systems and any number of frequency bands.

In the transmit path, data processor 110 processes data to be transmitted and provides an analog output signal to transmitter 130. Within transmitter 130, the analog output signal is amplified by an amplifier (Amp) 132, filtered by a lowpass filter 134 to remove images caused by digital-to-analog conversion, amplified by a VGA 136, and upconverted from baseband to radio frequency (RF) by a mixer 138. The upconverted signal is filtered by a filter 142 to remove images caused by the frequency upconversion, further amplified by a power amplifier (PA) 144 to obtain the desired output power level, routed through an output circuit 150, and transmitted via an antenna 152. Output circuit 150 may perform impedance matching, signal switching, filtering, and/or other functions, as described below.

In the receive path, antenna 152 receives signals from base stations and other transmitter stations and provides a received RF signal, which is routed through output circuit 150 and provided to receiver 160. Receiver 160 processes (e.g., amplifies, downconverts, and filters) the received RF signal and provides an analog input signal to data processor 110. Details of receiver 160 are not shown in FIG. 1 for simplicity.

FIG. 1 shows transmitter 130 implementing a direct-conversion architecture, which frequency upconverts a signal from baseband to RF in one stage. Transmitter 130 may also implement a super-heterodyne architecture, which frequency upconverts a signal from baseband to RF in multiple stages. A local oscillator (LO) generator 170 generates and provides LO signals to mixer 138. A phase locked loop (PLL) 172 receives control information from data processor 110 and provides control signals to LO generator 170 to generate the LO signals at the proper frequency.

FIG. 1 shows an exemplary transmitter design. In general, the conditioning of the signals in transmitter 130 may be performed by one or more stages of amplifier, filter, mixer, etc. These circuit blocks may be arranged differently from the configuration shown in FIG. 1. Furthermore, other circuit blocks not shown in FIG. 1 may also be used to condition the signals in the transmitter. Some circuit blocks in FIG. 1 may also be omitted. All or a portion of transmitter 130 may be implemented on an analog integrated circuit (IC), an RF IC (RFIC), a mixed-signal IC, etc.

Data processor 110 may perform various functions for wireless device 100, e.g., processing for transmitted and received data. A memory 112 may store program codes and data for data processor 110. Data processor 110 may be implemented on one or more application specific integrated circuits (ASICs) and/or other ICs.

Wireless device 100 may support communication with multiple wireless communication systems utilizing different radio technologies. These radio technologies may be based on Code Division Multiple Access (CDMA), Time Division Multiple Access (TDMA), Frequency division Multiple Access (FDMA), Orthogonal FDMA (OFDMA), Single-Carrier FDMA (SC-FDMA), etc. For example, wireless device 100 may support CDMA 1X and/or Wideband CDMA (WCDMA) as well as Global System for Mobile Communications (GSM). Alternatively or additionally, wireless device 100 may support other radio technologies such as Long Term Evolution (LTE), wireless local area network (WLAN), Bluetooth, etc. For clarity, much of the description below assumes that wireless device 100 supports CDMA (e.g., CDMA 1X and/or WCDMA) and GSM.

GSM is a TDMA radio technology that employs time division duplexing (TDD). For TDD, the downlink and uplink share a single frequency channel and are allocated different time intervals on the frequency channel. Switches are typically used to route an output RF signal from transmitter 130 to antenna 152 and to route a received RF signal from antenna 152 to receiver 160. CDMA 1X and WCDMA are two CDMA radio technologies that employ frequency division duplexing (FDD). For FDD, the downlink and uplink are allocated separate frequency channels, and a duplexer is typically used to route an output RF signal from transmitter 130 to antenna 152 and to route a received RF signal from antenna 152 to receiver 160. GSM and CDMA have other characteristics that can impact the design of power amplifiers, as described below.

Figure 2:
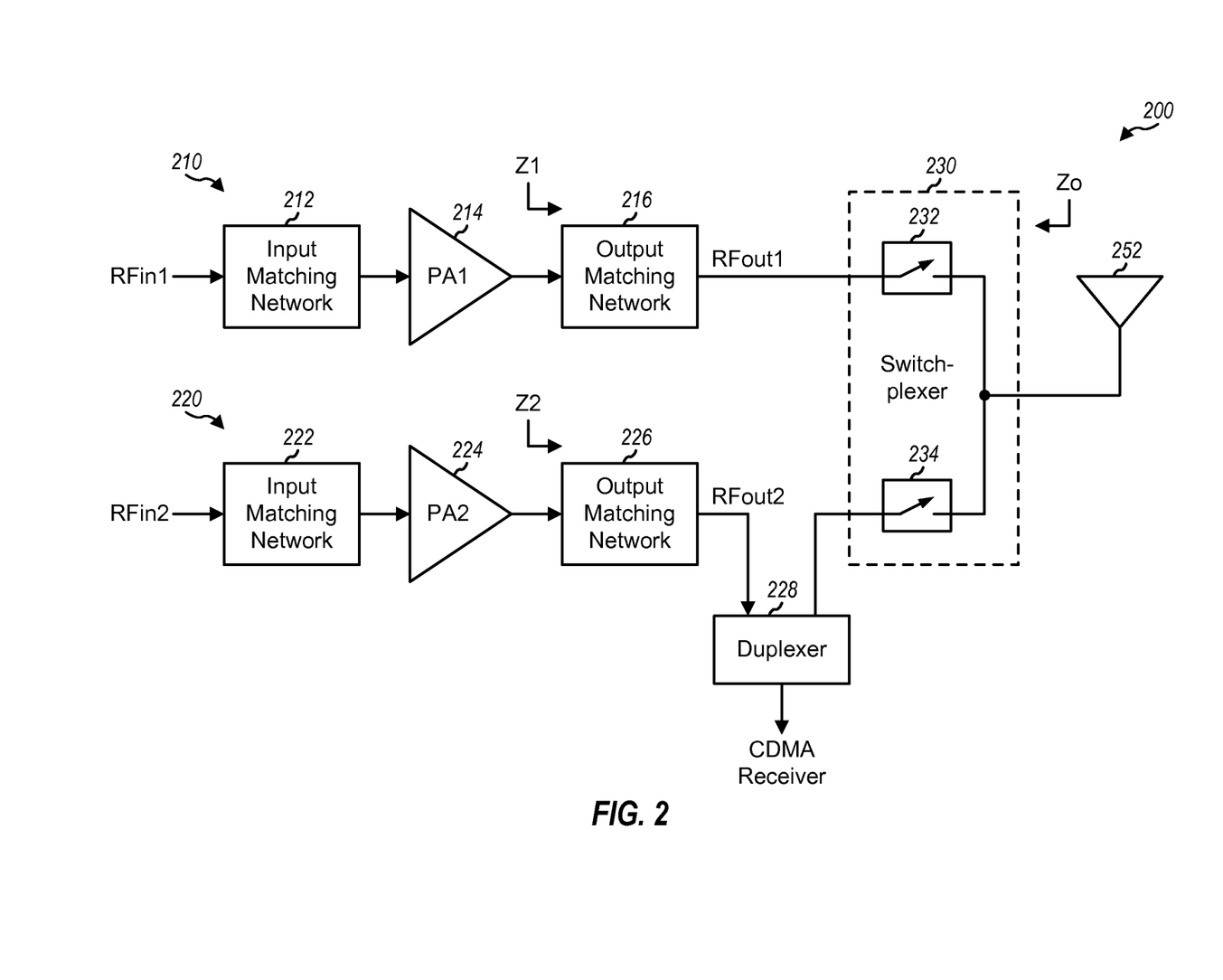
FIG. 2 shows a transmitter with two power amplifiers for two operating modes.

FIG. 2 shows a block diagram of a design of a transmitter 200 with separate power amplifiers for GSM and CDMA. Transmitter 200 includes a first signal path 210 for GSM and a second signal path 220 for CDMA. In the first signal path 210, a first input RF signal (RFin1) is routed through an input matching network 212, amplified by a power amplifier (PA1) 214, and routed through an output matching network 216. A first output RF signal (RFout1) from matching network 216 is provided to a switchplexer 230. In the second signal path 220, a second input RF signal (RFin2) is routed through an input matching network 222, amplified by a power amplifier (PA2) 224, and routed through an output matching network 226. A second output RF signal (RFout2) from matching network 226 is passed through a duplexer 228 and provided to switchplexer 230. Within switchplexer 230, a switch 232 routes the RFout1 signal from matching network 216 to antenna 252 when switch 232 is selected. A switch 234 routes the RFout2 signal from duplexer 228 to antenna 252 when switch 234 is selected. Switchplexer 230 may include one or more additional switches to couple one or more receivers to antenna 252.

Matching networks 212 and 222 perform input impedance matching for power amplifiers 214 and 224, respectively. Matching network 216 performs output impedance matching for power amplifier 214, provides an impedance of Z1 to power amplifier 214, and provides an impedance of Zo to antenna 252. Similarly, matching network 226 performs output impedance matching for power amplifier 224, provides an impedance of Z2 to power amplifier 224, and provides an impedance of Zo to duplexer 228. Z1 is the target output impedance for power amplifier 214 for GSM. Z2 is the target output impedance for power amplifier 224 for CDMA. Zo is the target impedance for antenna 252 and may be 50 Ohms or some other value.

GSM has a high maximum output power requirement, e.g., +33 dBm. However, GSM uses Gaussian Minimum Shift Keying (GMSK), which is a modulation technique that can provide an output RF signal with a constant envelope. Since linearity is not a concern for GSM due to the constant envelope, power amplifier 214 may be operated in a saturation region in order to improve power efficiency. The output impedance Z1 for power amplifier 214 may be determined based on the maximum output power (Pmax) for GSM and the power supply voltage (Vdd) for power amplifier 214 and may be given as $Z1 \propto Vdd/Pmax$. The output impedance Z1 may thus be lower for higher maximum output power and/or lower power supply voltage.

CDMA has a lower maximum output power requirement, e.g., +27 dBm. However, CDMA is a modulation technique that generates an output RF signal with variable envelope. Since linearity is important for CDMA due to the variable envelope, power amplifier 224 may be operated in a more linear region in order to improve linearity. The output impedance Z2 for power amplifier 224 may be determined based on the maximum output power for CDMA and the power supply voltage.

Figure 3:
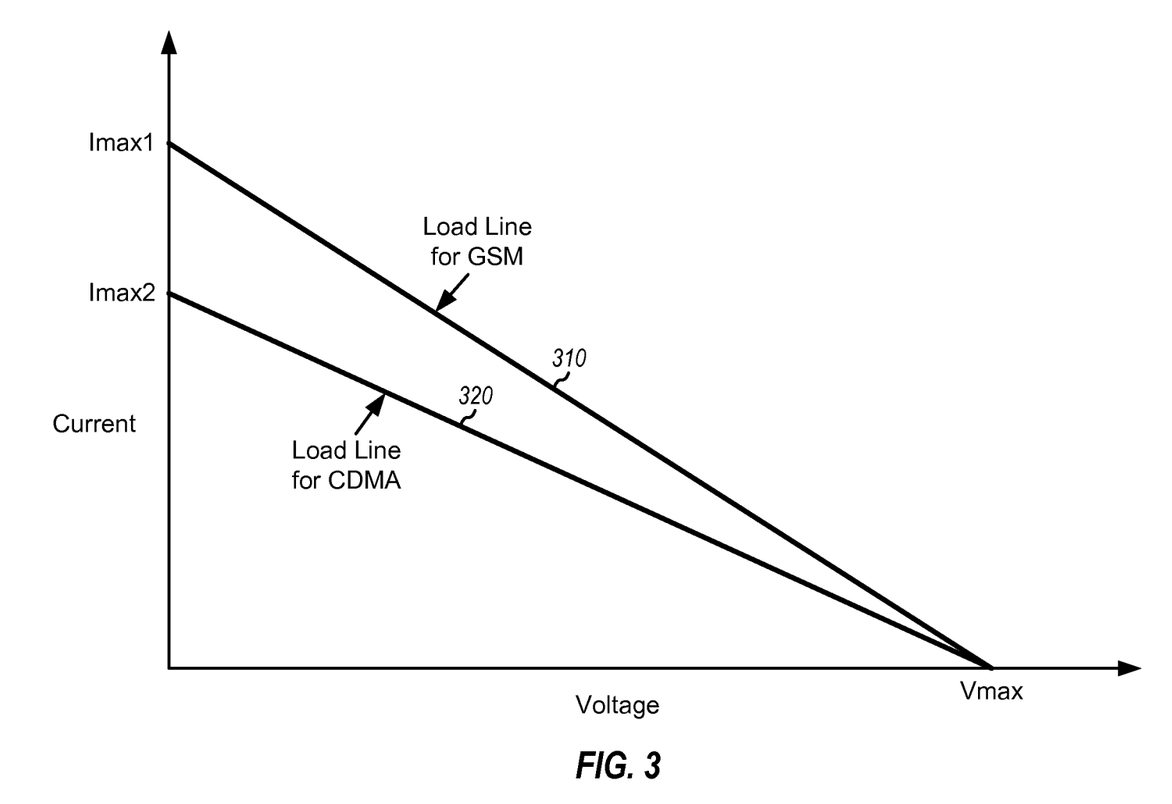
FIG. 3 shows exemplary load lines for the two power amplifiers in FIG. 2.

FIG. 3 shows exemplary load lines for power amplifiers 214 and 224 for GSM and CDMA. In FIG. 3, the horizontal axis represents output voltage, and the vertical axis represents output current. The maximum output voltage Vmax may be twice the power supply voltage Vdd. The maximum output current Imax1 for GSM may be dependent on the maximum output power for GSM. The maximum output current Imax2 for CDMA may be dependent on the maximum output power for CDMA. Imax1 for GSM may be greater than Imax2 for CDMA. A line 310 between Vmax and Imax1 represents a load line for GSM. A line 320 between Vmax and Imax2 represents a load line for CDMA. The output impedance observed by a power amplifier is equal to 1/slope, where "slope" is the slope of the load line for the power amplifier. The operating point for a power amplifier is a point along the load line for that power amplifier.

The design in FIG. 2 uses separate power amplifiers 214 and 224 for different radio technologies. The power amplifier and output matching network for each radio technology may be designed based on the requirements and characteristics of that radio technology. For example, power amplifier 214 may be operated in a saturation region for constant envelope GSM whereas power amplifier 224 may be backed off to a more linear region for variable envelope CDMA. Matching networks 216 and 226 may provide different load lines for power amplifiers 214 and 224, respectively, in order to obtain good performance for GSM and CDMA. However, the use of separate power amplifiers and separate output matching networks for GSM and CDMA may increase cost, increase circuit area, and degrade reliability.

In an aspect, a single power amplifier with a switched output matching circuit can support a plurality of operating modes with a load line that can be changed for different operating modes. Each operating mode may be associated with certain operating conditions for the power amplifier. For example, a first mode may be associated with saturated operation and a first load line for the power amplifier and may be used for GSM. A second mode may be associated with more linear operation and a second load line for the power amplifier and may be used for CDMA. The first mode may also be referred to as a GSM mode, and the second mode may be referred to as a CDMA mode. The use of a variable load line for different operating modes may improve performance for all operating modes.

Figure 4:
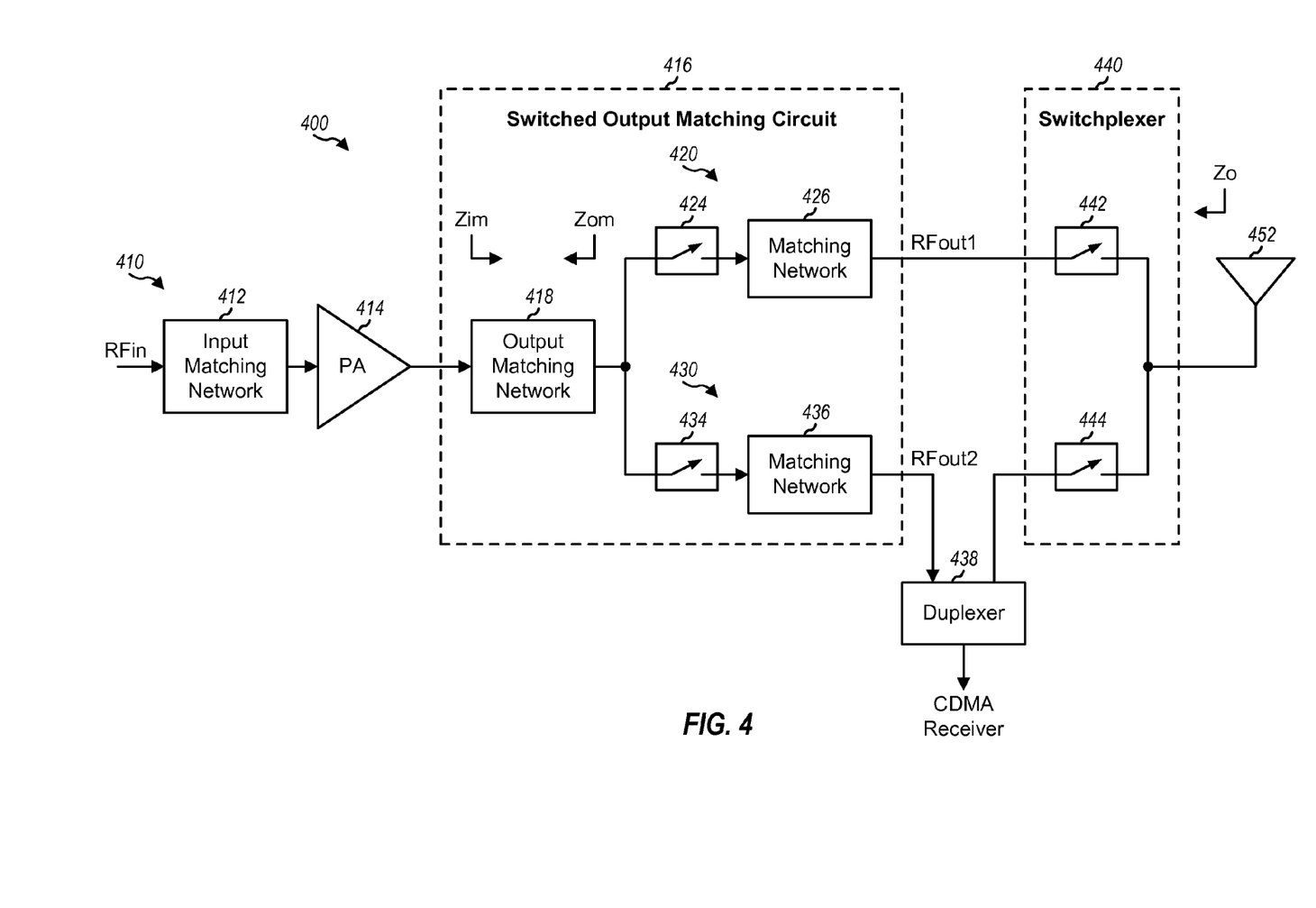
FIG. 4 shows a transmitter with a single power amplifier for two operating modes.

FIG. 4 shows a block diagram of an exemplary design of a transmitter 400 with a single power amplifier for GSM and CDMA. Transmitter 400 includes a common input path 410, a first output path 420 for GSM, and a second output path 430 for CDMA. In the common input path 410, an input RF signal (RFin) is routed through an input matching network 412, amplified by a power amplifier 414, and routed through an output matching network 418 to obtain an intermediate RF signal.

In the first output path 420, the intermediate RF signal is passed through a switch 424, routed through a matching network 426, and provided as a first output RF signal (RFout1) to a switchplexer 440. In the second output path 430, the intermediate RF signal is passed through a switch 434 and routed through a matching network 436. A second output RF signal (RFout2) from matching network 436 is passed through a duplexer 438 and provided to switchplexer 440. Within switchplexer 440, a switch 442 routes the RFout1 signal from matching network 426 to an antenna 452 when switch 442 is selected. A switch 444 routes the RFout2 signal from duplexer 438 to antenna 452 when switch 444 is selected. Switchplexer 440 may include one or more additional switches to couple one or more receivers to antenna 452.

Matching network 412 performs input impedance matching for power amplifier 414. Matching network 418 performs coarse output impedance matching for power amplifier 414. Matching network 418 has (i) an input impedance of Zim when its output is terminated with Zom and (ii) an output impedance of Zom when its input is terminated with Zim. Zom may be higher than Z1 and Z2, which are the target output impedances for power amplifier 414 in the GSM and CDMA modes, respectively. Matching network 418 may thus perform impedance transformation so that the higher Zom will result in less insertion loss due to the on resistance of switches 424 and 434. Matching network 426 performs fine output impedance matching for power amplifier 414 in the GSM mode. The combination of matching networks 418 and 426 provides an impedance of Z1 to power amplifier 414 and an impedance of Zo to antenna 452 in the GSM mode. Matching network 436 performs fine output impedance matching for power amplifier 414 in the CDMA mode. The combination of matching networks 418 and 436 provides an impedance of Z2 to power amplifier 414 and an impedance of Zo to antenna 452 in the CDMA mode. Different load lines may thus be obtained for the GSM and CDMA modes with different matching networks 426 and 436. Matching networks 418, 426 and 436 and switches 424 and 434 form a switched output matching circuit 416 for power amplifier 414.

Matching network 412 in FIG. 4 may be part of filter 142 in FIG. 1. Power amplifier 414 may correspond to power amplifier 144 in FIG. 1. Matching networks 418, 426 and 436, switches 424 and 434, duplexer 438, and switchplexer 440 may be part of output circuit 150 in FIG. 1. Switches 424 and 434 may be implemented with metal oxide semiconductor (MOS) transistors, transistors of other types, or other RF switches.

Figure 5A:
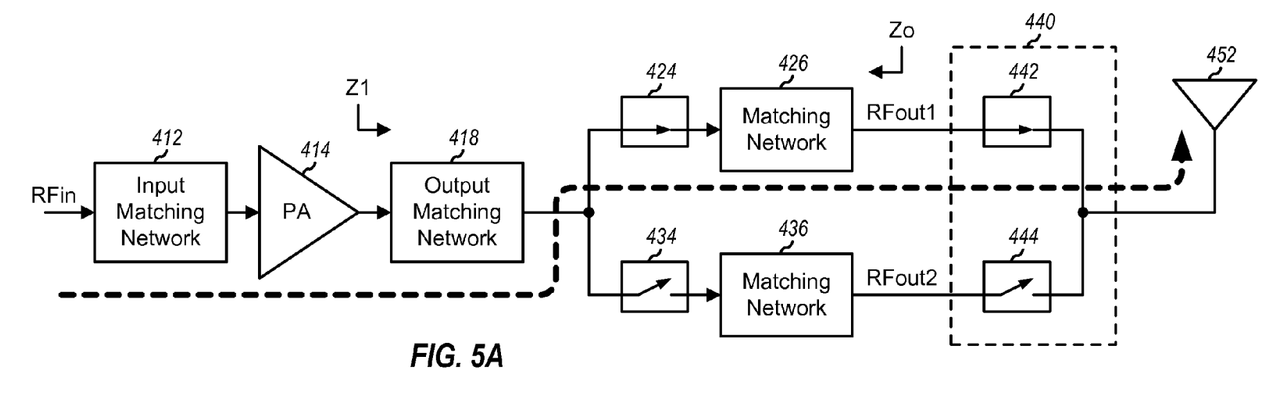
FIGS. 5A and 5B show operation of the transmitter in FIG. 4 in the two modes.

FIG. 5A shows operation of transmitter 400 in the GSM mode. In the GSM mode, switches 424 and 442 are closed, and switches 434 and 444 are opened. The RFin signal is passed through matching network 412, power amplifier 414, matching network 418, switch 424, matching network 426, and switch 442 to antenna 452. The output impedance observed by power amplifier 414 due to matching networks 418 and 426 is Z1. The impedance at antenna 452 is approximately Zo.

Figure 5B:
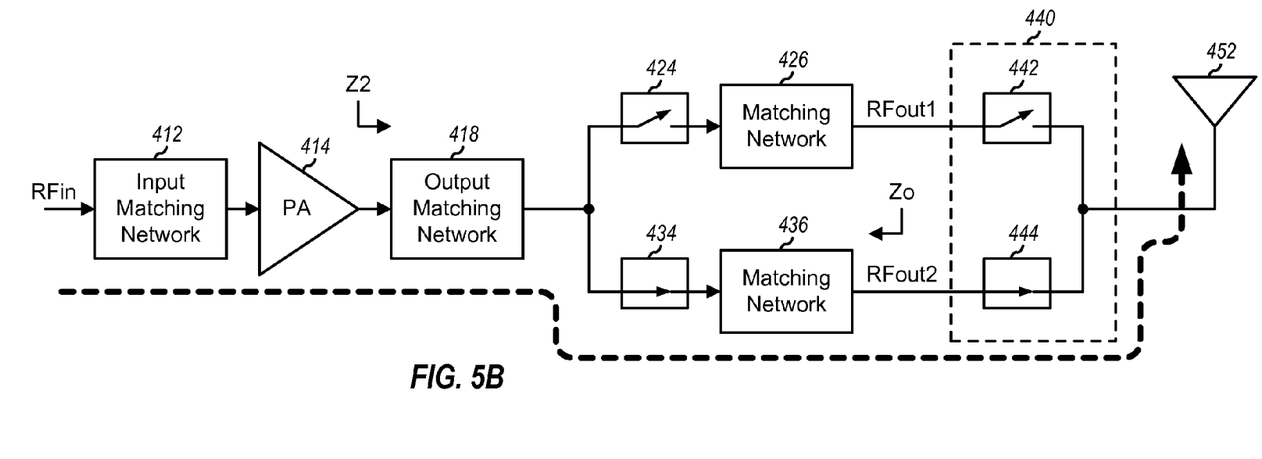

FIG. 5B shows operation of transmitter 400 in the CDMA mode. In the CDMA mode, switches 434 and 444 are closed, and switches 424 and 442 are opened. The RFin signal is passed through matching network 412, power amplifier 414, matching network 418, switch 434, matching network 436, and switch 444 to antenna 452. The output impedance observed by power amplifier 414 due to matching networks 418 and 436 is Z2, and the impedance at antenna 452 is approximately Zo.

Figure 6:
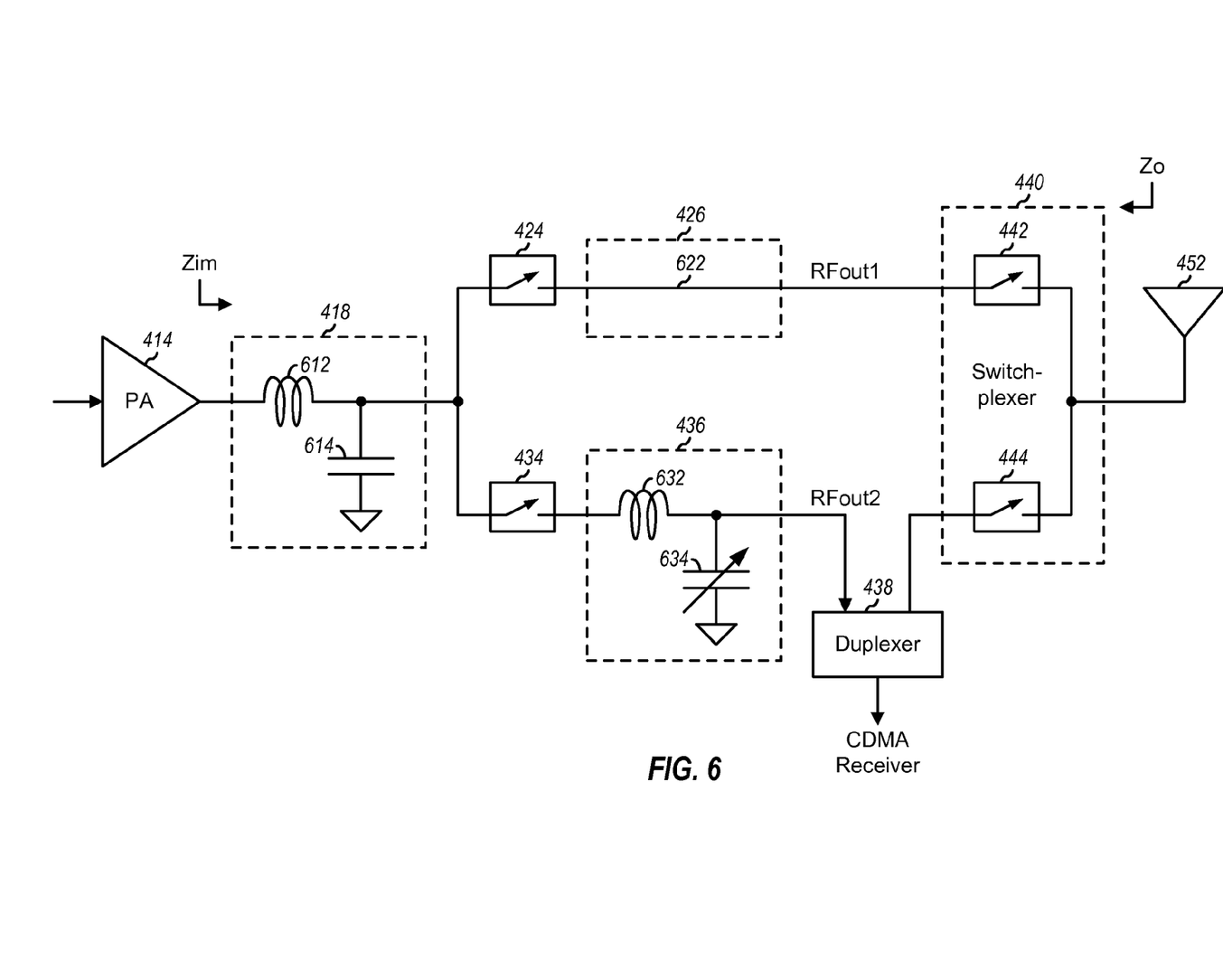
FIG. 6 shows matching networks within the transmitter in FIG. 4.

FIG. 6 shows an exemplary design of the matching networks within transmitter 400 in FIG. 4. In the exemplary design shown in FIG. 6, matching network 418 includes an inductor 612 coupled between the input and output of the matching network, and a capacitor 614 coupled between the output and circuit ground. The inductance of inductor 612 and the capacitance of capacitor 614 may be selected to obtain an input impedance of approximately Z1 and an output impedance of approximately Zo for matching network 418 at a target frequency. The target frequency may be the center frequency of a frequency band supported by transmitter 400.

Matching network 436 includes an inductor 632 coupled between the input and output of the matching network, and a tunable capacitor 634 coupled between the output and circuit ground. The inductance of inductor 632 and the capacitance of capacitor 634 may be selected such that the combination of matching networks 418 and 436 provide an impedance of approximately Z2 to power amplifier 414 and an impedance of approximately Zo to antenna 452 at the target frequency. In the exemplary design shown in FIG. 6, capacitor 634 may have a tunable capacitance that may be varied to obtain better matching and improved linearity in the CDMA mode. In another exemplary design that is not shown in FIG. 6, capacitor 634 may have a fixed capacitance that may be selected to obtain good performance in the CDMA mode.

In the exemplary design shown in FIG. 6, matching network 426 is implemented with a wire 622 that simply passes the RF signal. The output impedance matching in the GSM mode may be performed entirely by matching network 418. In another exemplary design that is not shown in FIG. 6, matching network 426 may include an inductor coupled between the input and output of the matching network, and a capacitor coupled between the output and circuit ground. The inductance of the inductor and the capacitance of the capacitor may be selected such that the combination of matching networks 418 and 426 provide an impedance of approximately Z1 to power amplifier 414 and an impedance of approximately Zo to antenna 452 at the target frequency.

FIG. 6 shows an exemplary design in which matching network 418 has an input impedance Zim of approximately Z1 when its output is terminated with Zo. For example, Z1 may be approximately 4 Ohms, Z2 may be approximately 6 Ohms, and Zim may be approximately 4 Ohms. Matching network 426 may be omitted (as shown in FIG. 6) or may be included to provide filtering without changing Zim. Matching network 436 may change Zim to obtain Z2.

In another exemplary design, matching network 418 may be designed to have an input impedance roughly equal to the average of Z1 and Z2, or Zim≈(Z1+Z2)/2. For the example given above, Zim may be approximately 5 Ohms. Matching network 426 may change Zim to obtain Z1, and matching network 436 may change Zim to obtain Z2.

In yet another exemplary design, matching network 418 may be designed to have an input impedance roughly equal to Z2. For the example given above, Zim may be approximately 6 Ohms. Matching network 426 may change Zim to obtain Z1. Matching network 436 may be omitted or may be included to provide filtering without changing Zim.

Figure 7A:
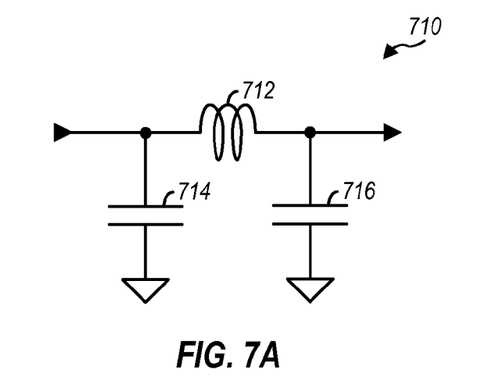
FIGS. 7A, 7B and 7C show three exemplary designs of a matching network.

FIG. 7A shows an exemplary design of a matching network 710, which may be used for any of the matching networks shown in FIG. 4. In this exemplary design, matching network 710 includes an inductor 712 coupled between the input and output of the matching network, a capacitor 714 coupled between the input and circuit ground, and a capacitor 716 coupled between the output and circuit ground.

Figure 7B:
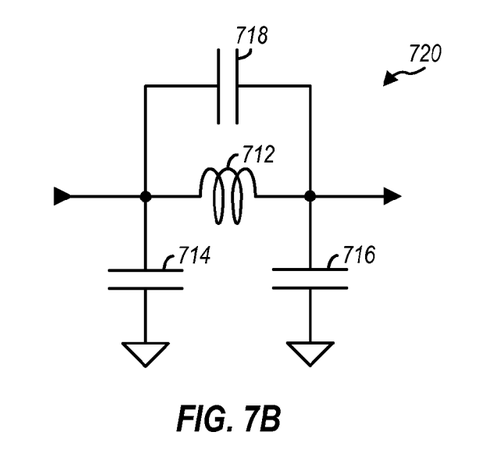

FIG. 7B shows an exemplary design of a matching network 720, which may also be used for any of the matching networks shown in FIG. 4. In this exemplary design, matching network 720 includes all of the circuit components in matching network 710 in FIG. 7A. Matching network 720 further includes a capacitor 718 coupled between the input and output of the matching network. Inductor 712 and capacitor 718 form a resonator circuit that may be used to provide high attenuation of undesired signal components at the resonant frequency.

Figure 7C:
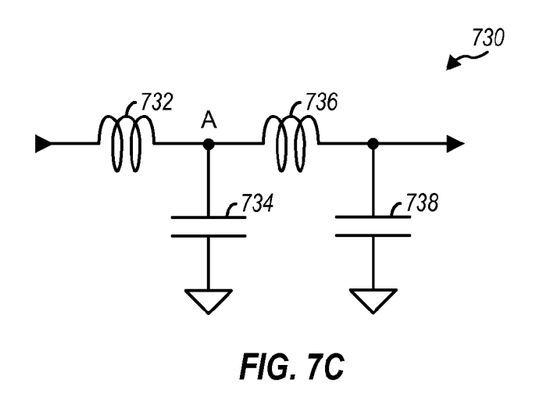

FIG. 7C shows an exemplary design of a two-stage matching network 730, which may also be used for any of the matching networks shown in FIG. 4. In this exemplary design, the first stage of matching network 730 includes (i) an inductor 732 coupled between the input of the matching network and node A and (ii) a capacitor 734 coupled between node A and circuit ground. The second stage of matching network 730 includes (i) an inductor 736 coupled between node A and the output of the matching network and (ii) a capacitor 738 coupled between the output and circuit ground.

Some exemplary designs of matching networks are shown in FIGS. 6, 7A, 7B and 7C. A matching network may also be implemented with other designs and other circuit topologies. A matching network may include one or more inductors and one or more capacitors with fixed values. A matching network may also include one or more circuit elements (e.g., capacitors) with tunable values. Different complex impedances may be obtained by varying a tunable capacitor and may result in better performance in terms of linearity and efficiency.

Figure 8A:
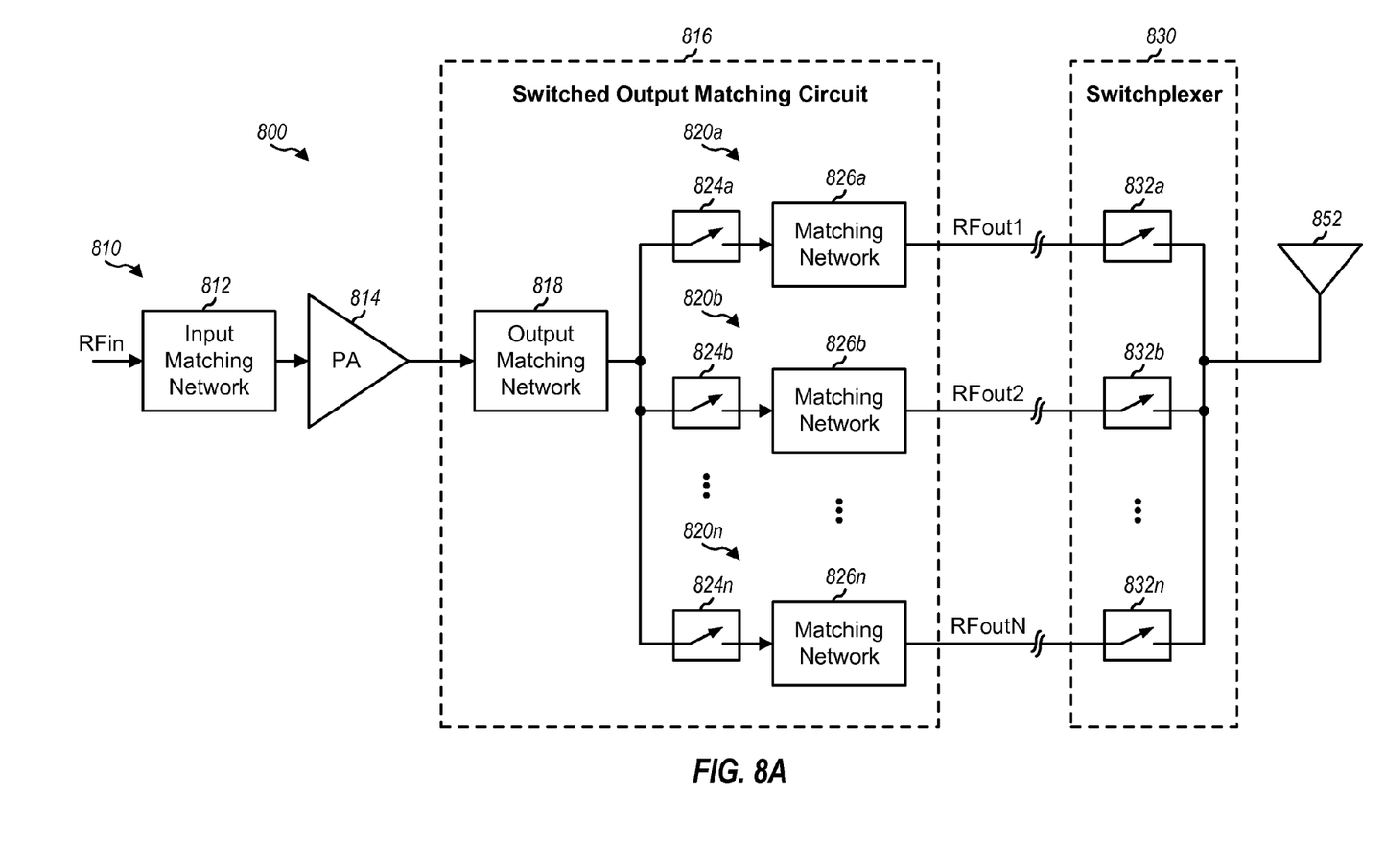
FIGS. 8A and 8B show two transmitters with a single power amplifier and a plurality of output paths for a plurality of operating modes.

FIG. 8A shows a block diagram of an exemplary design of a transmitter 800 with a single power amplifier for N operating modes, where N is greater than one. Transmitter 800 includes a common input path 810 and N output paths 820a through 820n for the N operating modes. In the common input path 810, an input RF signal (RFin) is routed through an input matching network 812, amplified by a power amplifier 814, and routed through an output matching network 818 to obtain an intermediate RF signal. One of the N output paths 820a through 820n may be selected at any given moment. For the selected output path, the intermediate RF signal is passed through a switch 824, routed through a matching network 826 (and possibly a duplexer and/or other circuit blocks not shown in FIG. 8A), passed through another switch 832, and provided to antenna 852. Matching networks 826a through 826n provide N output RF signals RFout1 through RFoutN, respectively. Switches 832a through 832n for the N output paths may be part of a switchplexer 830, which may include one or more additional switches to couple one or more receivers to antenna 852.

Matching network 812 performs input impedance matching for power amplifier 814. Matching network 818 performs coarse output impedance matching for power amplifier 814. Matching network 818 has (i) an input impedance of Zim when its output is terminated with Zom and (ii) an output impedance of Zom when its input is terminated with Zim. The target output impedance for power amplifier 814 may be Z1 through ZN for the N operating modes. Zom may be higher than Z1 through ZN and may be closer to Zo in order to reduce insertion loss due to the on resistance of switches 824a through 824n. Matching networks 826a through 826n perform fine output impedance matching for power amplifier 814 for the N operating modes. The combination of matching networks 818 and 826a provides an impedance of Z1 to power amplifier 814 and an impedance of Zo to antenna 852 in the first operating mode. In general, for the n-th output path, the combination of matching network 818 and matching network 826 for that output path provides an impedance of Zn to power amplifier 814 and an impedance of Zo to antenna 852 in the n-th operating mode, where n=1, . . . , N. Different load lines may thus be obtained for the N operating modes with different matching networks 826a through 826n. Matching networks 818 and 826a through 826n and switches 824a through 824n form a switched output matching circuit 816 for power amplifier 814.

Figure 8B:
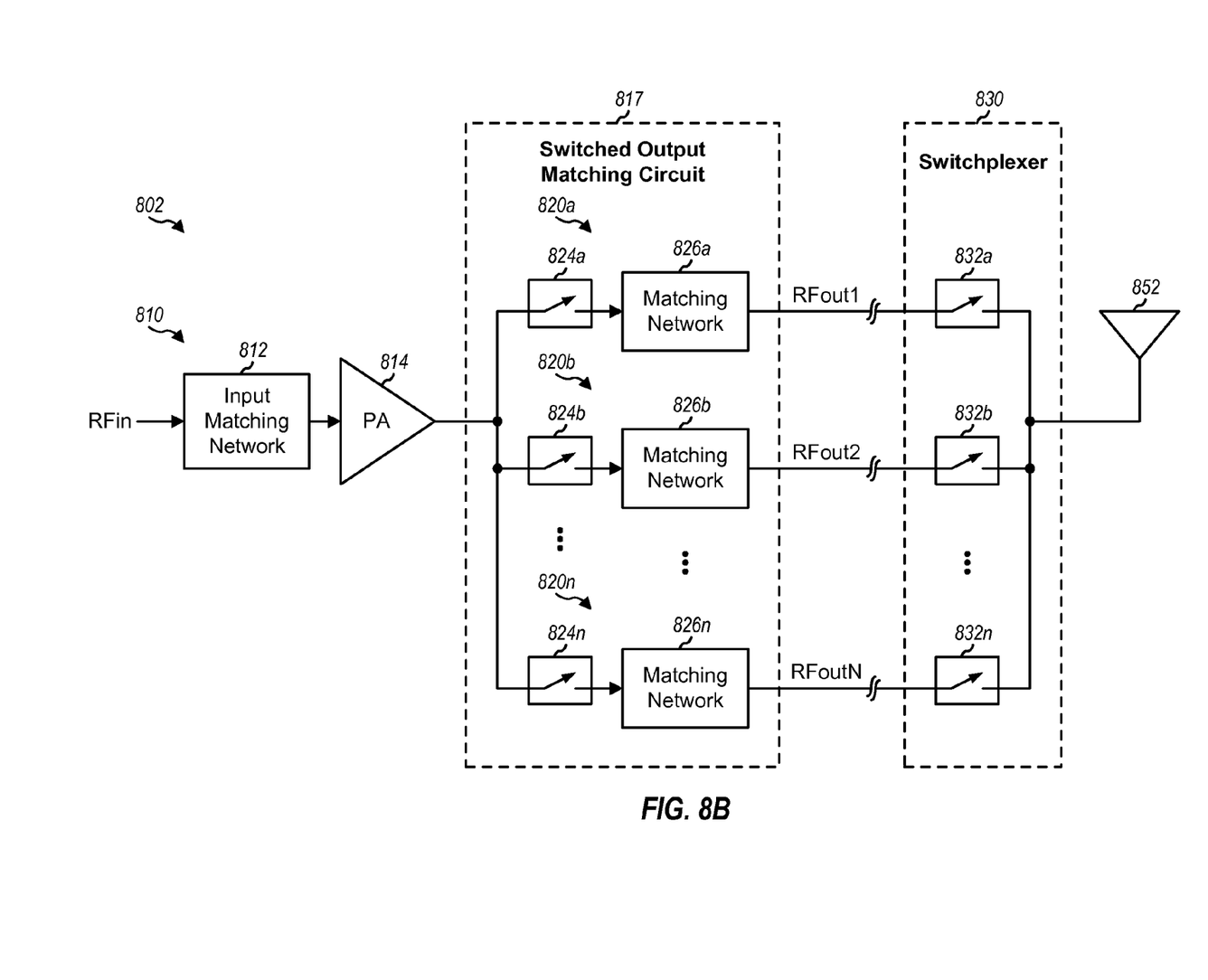

FIG. 8B shows a block diagram of an exemplary design of a transmitter 802 with a single power amplifier for N operating modes. Transmitter 802 includes all circuit blocks in transmitter 800 in FIG. 8A except for matching network 818, which is omitted in transmitter 802. N switches 824a through 824n have one end coupled to the output of power amplifier 814 and the other end coupled to N matching networks 826a through 826n, respectively. Matching network 826 for the n-th output path may be designed to provide an impedance of Zn to power amplifier 814 and an impedance of Zo to antenna 852 in the n-th operating mode, for n=1, . . . , N. Matching networks 826a through 826n and switches 824a through 824n form a switched output matching circuit 817 for power amplifier 814.

Matching network 812 in FIGS. 8A and 8B may be part of filter 142 in FIG. 1. Power amplifier 814 may correspond to power amplifier 144 in FIG. 1. Matching networks 818 and 826a through 826n, switches 824a through 824n, and switchplexer 830 may be part of output circuit 150 in FIG. 1.

In general, a transmitter may support any number of operating modes (N). The N operating modes may correspond to different power amplifier requirements, e.g., for linearity, efficiency, etc. The N operating modes may be used for different radio technologies (e.g., GSM and CDMA), as described above. The N operating modes may also be used for different output power levels, different power supply voltages, different IC process corners, different temperatures, etc.

For all transmitters described herein, each matching network within a given transmitter may be designed to provide the desired impedance matching (e.g., a target input impedance and a target output impedance) to obtain good linearity and efficiency for the power amplifier in the transmitter. The target output impedance Zn for the power amplifier for each operating mode may be dependent on the requirements and characteristics of the output RF signal for that operating mode. Each matching network may also be designed to provide the desired filtering. For example, it may be desirable to attenuate the second and/or third harmonic of the output RF signal in order to improve linearity and efficiency.

As shown in FIGS. 4, 8A and 8B, a single power amplifier with a plurality of output paths may be used to support a plurality of operating modes, e.g., for different radio technologies. This single power amplifier design may reduce cost and area over a design using a separate power amplifier for each operating mode, e.g., as shown in FIG. 2. The single power amplifier may be coupled to different output paths via RF switches, which may be efficiently implemented with MOS transistors or some other electronic switches. An additional matching network may be added in each output path to obtain the desired load line for the operating mode supported by that output path. Since only one output path may be active at any given time, the desired impedance matching may be achieved by each output path without affecting the other output paths. The power amplifier may then observe a different (possibly more suitable) load line for each operating mode. Different load lines may be obtained by using digitally switched output paths that can be readily supported by a switchplexer.

The use of different output paths for different operating modes may provide certain advantages over the use of a single output path with analog tunable circuit elements, e.g., varactors, micro-electro-mechanical system (MEMS) circuit components, etc. For example, different output paths may provide more range than analog tunable circuit elements and may avoid the need for high quality tunable circuit elements.

In an exemplary design, an apparatus (e.g., a wireless device, an integrated circuit, etc.) may include a power amplifier and a plurality of output paths, e.g., as shown in FIG. 4, 8A or 8B. The power amplifier may receive an input RF signal and provide an amplified RF signal. The plurality of output paths may be coupled (directly or indirectly) to the power amplifier. Each output path may provide a different target output impedance for the power amplifier and may route the amplified RF signal from the power amplifier to an antenna when that output path is selected.

The apparatus may further include a matching network (e.g., matching network 418 in FIG. 4 or matching network 818 in FIG. 8A) coupled between the power amplifier and the plurality of output paths. The matching network may perform impedance transformation from a first impedance (e.g., Zim) at the output of the power amplifier to a second impedance (e.g., Zom) at the output of the matching network. The first impedance may be determined based on the target output impedances (e.g., Z1 through ZN) for the power amplifier for the plurality of output paths. The second impedance may be determined by (e.g., may be close to) a target impedance (e.g., Zo) for the antenna.

In an exemplary design, each output path may comprise a matching network coupled in series with a switch. The matching network may provide the target output impedance for the power amplifier when the output path is selected. The switch may couple the output path to the power amplifier when the output path is selected and may decouple the output path from the power amplifier otherwise. The matching network may be implemented as shown in FIG. 6, 7A, 7B or 7C. The matching network may also be implemented with a short (e.g., matching network 426 in FIG. 6) or may have a tunable capacitor (e.g., matching network 436 in FIG. 6).

The apparatus may further include a switchplexer comprising a plurality of switches coupled (directly or indirectly) to the plurality of output paths. Each switch may route the amplified RF signal from the power amplifier via an associated output path to the antenna when that switch is selected.

The plurality of output paths may support a plurality of operating modes. Each operating mode may be associated with different operating characteristics for the power amplifier. The plurality of operating modes may include first and second operating modes. The first operating mode may support higher maximum output power and may have the power amplifier operating in a saturation region for higher efficiency. The second mode may provide higher linearity and may have the power amplifier operating outside the saturation region to obtain higher linearity. The plurality of output paths may support a plurality of radio technologies. For example, a first output path may support a first radio technology (e.g., GSM) with an output RF signal having a constant envelope. A second output path may support a second radio technology (e.g., CDMA, OFDM, SC-FDMA, etc.) with an output RF signal having a variable envelope.

In another exemplary design, a wireless device may include a power amplifier, a switched output matching circuit, a switchplexer, and an antenna, e.g., as shown in FIG. 4, 8A or 8B. The power amplifier may receive an input RF signal and provide an amplified RF signal. The switched output matching circuit may support a plurality of operating modes and may provide different target output impedances for the power amplifier for the plurality of operating modes. The switchplexer may route the amplified RF signal from the power amplifier via the switched output matching circuit to the antenna.

In an exemplary design, the switched output matching circuit may comprise an output matching network and a plurality of output paths, e.g., as shown in FIG. 4 or 8A. The output matching network may perform impedance transformation from a first impedance at the power amplifier output to a second impedance at the matching circuit output. Each output path may provide a different target output impedance for the power amplifier and may include a matching network and a switch. In another exemplary design, the switched output matching circuit may comprise a plurality of output paths coupled directly to the power amplifier, e.g., as shown in FIG. 8B.

Figure 9:
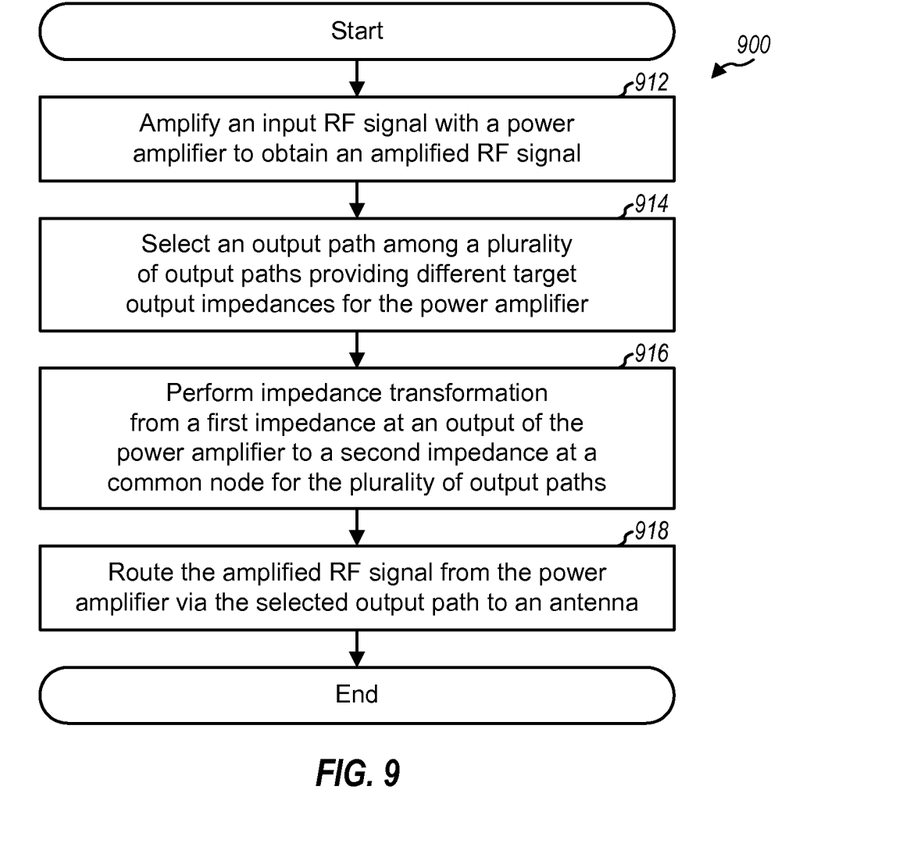
FIG. 9 shows a process for signal transmission.

FIG. 9 shows an exemplary design of a process 900 for signal transmission. An input RF signal may be amplified with a power amplifier to obtain an amplified RF signal (block 912). An output path may be selected from among a plurality of output paths providing different target output impedances for the power amplifier (block 914). Impedance transformation may be performed with a matching network from a first impedance at an output of the power amplifier to a second impedance at a common node for the plurality of output paths (block 916). The first impedance may be close to a target impedance for the power amplifier, and the second impedance may be close to a target impedance for an antenna. The amplified RF signal may be routed from the power amplifier via the selected output path to the antenna (block 918). For block 918, the amplified RF signal may be passed via (i) a switch connecting the selected output path to the power amplifier and (ii) a matching network providing the target output impedance for the power amplifier. The plurality of output paths may support a plurality of operating modes, and each operating mode may be associated with different operating characteristics for the power amplifier.

The power amplifier and switched output matching circuit described herein may be implemented on an IC, an analog IC, an RFIC, a mixed-signal IC, an ASIC, a printed circuit board (PCB), an electronic device, etc. The power amplifier and output paths may also be fabricated with various IC process technologies such as complementary metal oxide semiconductor (CMOS), N-channel MOS (NMOS), P-channel MOS (PMOS), bipolar junction transistor (BJT), bipolar-CMOS (BiCMOS), silicon germanium (SiGe), gallium arsenide (GaAs), etc.

An apparatus implementing the power amplifier and switched output matching circuit described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but is to be accorded the widest scope consistent with the principles and novel features disclosed herein.

What is claimed is:

1. An apparatus for wireless communication, comprising:
   a power amplifier to receive an input radio frequency (RF) signal and provide an amplified RF signal;
   an output matching network configured to receive the amplified RF signal; and
   a plurality of output paths coupled by switches to the output matching network, each output path provides a different target output impedance for the power amplifier and routes the amplified RF signal from the power amplifier to an antenna when the output path is selected, wherein an output impedance of the output matching network is greater than each different target output impedance for the power amplifier for each output path.

2. The apparatus of claim 1, further comprising:
   a matching network coupled between the power amplifier and the plurality of output paths, the matching network performs impedance transformation from a first impedance at an output of the power amplifier to a second impedance at an output of the matching network.

3. The apparatus of claim 2, the first impedance is determined based on target output impedances for the power amplifier for the plurality of output paths, and the second impedance is determined by a target impedance for the antenna.

4. The apparatus of claim 1, each output path comprising:
   a matching network to provide the target output impedance for the power amplifier when the output path is selected; and
   a switch coupled in series with the matching network, the switch couples the output path to the power amplifier when the output path is selected and decouples the output path from the power amplifier when the output path is not selected.

5. The apparatus of claim 4, the plurality of output paths include an output path comprising a matching network implemented with a short.

6. The apparatus of claim 4, the tunable matching network comprising a a tunable capacitor.

7. The apparatus of claim 1, the plurality of output paths support a plurality of operating modes, each operating mode is associated with different operating characteristics for the power amplifier.

8. The apparatus of claim 7, the plurality of operating modes include first and second operating modes, the first operating mode supports higher maximum output power than the second operating mode, and the second operating mode provides higher linearity than the first operating mode.

9. The apparatus of claim 7, the plurality of operating modes include first and second operating modes, the power amplifier operates in a saturation region for higher efficiency in the first operating mode and operates outside the saturation region for higher linearity in the second operating mode.

10. The apparatus of claim 1, the plurality of output paths support a plurality of radio technologies, each output path supports a different set of at least one radio technology.

11. The apparatus of claim 1, the plurality of output paths include first and second output paths, the first output path supports a first radio technology with an output RF signal having a constant envelope, and the second output path supports a second radio technology with an output RF signal having a variable envelope.

12. The apparatus of claim 11, the first radio technology is Global System for Mobile Communications (GSM), and the second radio technology is Code Division Multiple Access (CDMA).

13. The apparatus of claim 1, further comprising:
   a switchplexer comprising a plurality of switches coupled to the plurality of output paths, each switch routing the amplified RF signal from the power amplifier via an associated output path to the antenna when the switch is selected.

14. A wireless device comprising:
   a power amplifier to receive an input radio frequency (RF) signal and provide an amplified RF signal;
   a switched output matching circuit coupled to the power amplifier and to support a plurality of operating modes, the switched output matching circuit provides different target output impedances for the power amplifier for the plurality of operating modes, wherein an output impedance of the switched output matching circuit is greater than each different target output impedance for the power amplifier for each operating mode
   a switchplexer coupled to the switched output matching circuit and to route the amplified RF signal from the power amplifier via the switched output matching circuit; and
   an antenna coupled to the switchplexer and to transmit the amplified RF signal received from the switchplexer.

15. The wireless device of claim 14, the switched output matching circuit comprising
   an output matching network coupled to an output of the power amplifier, the output matching network performs impedance transformation from a first impedance at the output of the power amplifier to a second impedance at an output of the output matching network, and
   a plurality of output paths coupled to the output matching network, each output path provides a different target output impedance for the power amplifier.

16. The wireless device of claim 14, the switched output matching circuit comprising a plurality of output paths, each output path comprising:

a matching network to provide a target output impedance for the power amplifier when the output path is selected; and a switch coupled in series with the matching network, the switch couples the output path to the power amplifier when the output path is selected and decouples the output path from the power amplifier when the output path is not selected.

17. The wireless device of claim 14, the plurality of operating modes include first and second operating modes, the first operating mode supports higher maximum output power than the second operating mode, and the second operating mode provides higher linearity than the first operating mode.

18. A method of signal transmission, comprising:
   amplifying an input radio frequency (RF) signal with a power amplifier to obtain an amplified RF signal;
   providing different target output impedances for the power amplifier for a plurality of output paths with a matching circuit;
   selecting by switches an output path among the plurality of output paths providing different target output impedances for the power amplifier, wherein an output impedance of the matching circuit is greater than each different target output impedance for the power amplifier for each output path; and
   routing the amplified RF signal from the power amplifier via the selected output path to an antenna.

19. The method of claim 18, further comprising:
   performing impedance transformation from a first impedance at an output of the power amplifier to a second impedance at a common node for the plurality of output paths.

20. The method of claim 18, the routing the amplified RF signal comprising:
   passing the amplified RF signal via a switch in the selected output path; and
   passing the amplified RF signal via a matching network providing a target output impedance for the power amplifier for the selected output path.

21. The method of claim 18, the plurality of output paths support a plurality of operating modes, each operating mode is associated with different operating characteristics for the power amplifier.

22. An apparatus for signal transmission, comprising:
   means for amplifying an input radio frequency (RF) signal to obtain an amplified RF signal;
   means for providing different target output impedances for the means for amplifying for a plurality of output paths;
   means for selecting by switches an output path among the plurality of output paths, wherein an output impedance of the means for providing different target output impedances is greater than each different target output impedance for the means for amplifying for each output path; and
   means for routing the amplified RF signal from the means for amplifying via the selected output path to an antenna.

23. The apparatus of claim 22, further comprising:
   means for performing impedance transformation from a first impedance at an output of the means for amplifying to a second impedance at a common node for the plurality of output paths.

24. The apparatus of claim 22, the means for routing the amplified RF signal comprising:
   means for passing the amplified RF signal via a switch in the selected output path; and
   means for passing the amplified RF signal via a matching network providing a target output impedance for the means for amplifying for the selected output path.

25. The apparatus of claim 22, the plurality of output paths support a plurality of operating modes, each operating mode is associated with different operating characteristics for the means for amplifying.

* * * * *